(12) United States Patent
Nakaigawa

(10) Patent No.: US 6,177,900 B1
(45) Date of Patent: Jan. 23, 2001

(54) CIRCUIT FOR SELECTING ONE OF DIVIDED ENCODERS FOR ANALOG TO DIGITAL CONVERTER

(75) Inventor: Sachio Nakaigawa, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/197,041

(22) Filed: Nov. 20, 1998

(30) Foreign Application Priority Data

Nov. 21, 1997 (JP) .................................................... 9-338104

(51) Int. Cl.[7] .................................................. H03M 1/36
(52) U.S. Cl. ........................................... 341/160; 341/155
(58) Field of Search .................................. 341/155, 161, 341/163, 160

(56) References Cited

U.S. PATENT DOCUMENTS

| | | | | |
|---|---|---|---|---|
| 5,155,489 | * | 10/1992 | Gulczynski | 341/160 |
| 5,243,348 | * | 9/1993 | Jackson | 341/64 |
| 5,252,974 | * | 10/1993 | Gulczynski | 341/142 |
| 5,877,720 | * | 3/1999 | Setty et al. | 341/159 |
| 5,955,980 | * | 9/1999 | Hanna | 341/120 |

FOREIGN PATENT DOCUMENTS

| | | |
|---|---|---|
| 5-75643 | 3/1993 | (JP) . |
| 9-8662 | 1/1997 | (JP) . |

* cited by examiner

*Primary Examiner*—Peguy Jean Pierre

(57) ABSTRACT

An encoder is divided into plural decoders, and one of the plural decoders is selected in accordance with a level of a thermometric data which is dependent on a level of an analog signal to be converted to a digital signal. The digital signal is determined by bit signals supplied from the selected encoder. For this structure, the non-selected decoders are not necessary to be pre-charged.

4 Claims, 9 Drawing Sheets

CIRCUIT FOR SELECTING ONE OF DIVIDED ENCODERS FOR ANALOG TO DIGITAL CONVERTER

FILED OF THE INVENTION

The present invention relates to a circuit for selecting one of divided encoders for an analog to digital (A/D) converter, and more particularly to an A/D converter in which high speed A/D conversion operation is realized and power consumption is decreased.

BACKGROUND OF THE INVENTION

As a conventional A/D converter, for example, Japanese Patent Application Laid-Open No. 9-8662 discloses an encoding circuit for an A/D converter having a bit line divisional buffer, in which bit lines of encoders are divided into plurality such that the number of transistors connected to bit lines is reduced, so as to reduce a precharging time and an encoding time of the encoders.

FIG. 1 shows a conventional encoding circuit, wherein the encoding circuit comprises selection transistors 117 which serves as selection transistor switches for discharging bit lines, code selection signal terminals 118 for controlling the selection transistors 117 by code selection signal, and bit lines 119 to 121, to each of which selection transistors 117 are connected.

The encoding circuit further comprises bit line precharging transistors 115, encoding transistors 116, and a control signal terminal 114 for controlling the precharging transistors 115 by control signals, and the encoding transistors 116 discharge the bit lines 119 to 121, when the selection transistors 117 are turned on. First and second encoders 133 and 134 are composed of the selection transistors 117, the bit lines 119 to 121, the precharging transistors 115 and the encoding transistors 116, respectively.

Encoded signals 135 output from the first encoder 133 are input to first input terminals of a bit line divisional buffer 137 comprising AND circuits 138, and encoded signals 136 output from the second encoder 134 are input to second input terminals of the bit line divisional buffer 137.

In the conventional encoding circuit, a charge loaded on the bit line is decreased by dividing the bit lines into plural encoders, and the logic signals divided into plural groups are synthesized by a single bit line divisional buffer provided at the next stage.

Next, operation of the conventional encoding circuit will be explained.

First, when the control signal input to the control signal terminal 114 becomes to L (low) level, in the first and second encoders 133 and 134, the respective precharging transistors 115 thereof are switched to ON state and the respective encoding transistors 116 thereof are switched to OFF state.

Next, all of the bit lines 119 to 121 of the first and second encoders 133 and 134 are precharged via the precharging transistors 115 by a power source.

During the period when the control signal of the control signal terminal 114 is kept at the L level, data to be converted are transmitted to the code selection signal terminal 118 (P0 to P7), and it is determined whether the respective selection transistors 117 should be switched to ON or OFF state in response thereto. Among the code selection signal terminal P0 to P7, the code selection signal terminal P5 is connected to an encoder (not shown), which encodes all of the 3-bits to be "1".

Then, all of the bit lines 119 to 121 in the first and second encoders 133 and 134 are sufficiently charged, and the states of the respective selection transistors 117 are determined such that the data should be converted into a desired binary code. Thereafter, the control signal input to the control signal terminal 114 becomes to H (high) level, and the selection transistors 117 are switched to ON or OFF state in response to a signal "1" or "0" which is input to the code selection signal terminals P0 to P7, then some of the bit lines are discharged by the selection transistors 117 of the ON state and the encoding transistor 116 which is turned on.

Encoded signals 135 (D10 to D12) and 136 (D20 to D22) are output from the first and second encoders, respectively. Finally, the encoded signals 135 and 136 are input to the bit line divisional buffer 136, and signals synthesized thereat are output as a desired binary code signal from digital signal output terminals 122 (G0 to G2).

However, according to the conventional bit line divisional encoding circuit, there are following disadvantages.

The first disadvantage is that when data to be converted are provided in a certain order, some of bit lines are unnecessarily precharged, so that the electric power is excessively consumed.

The second disadvantage is that since divided data should be synthesized, time delay is occurred at a logic signal-sythesizing circuit.

The third disadvantage is that an operation state requires two steps of precharging period and active (discharging) period. Accordingly, for the purpose of conducting a converting operation with a higher speed, time duration of the active period in which the data is fixed can not help being excessively reduced, or a converting operation speed for the whole A/D converting circuit is determined by the structure of the encoding circuit.

The fourth disadvantage is that, since the bit lines may be at floating state in some case during the active period, it becomes difficult to apply the encoding circuit to operation requiring only the low-speed conversion, thereby reducing freedom of circuit design.

SUMMARY OF THE INVENTION

Accordingly, it is an object of the invention is to provide a circuit for selecting one of divided encoders for an A/D converter, in which the operating speed is improved, and at the same time, unnecessary power consumption is prevented.

It is another object of the invention to provide a circuit for selecting one of divided encoders for an A/D converter for which freedom of circuit design is high.

According to the invention, a circuit for selecting one of divided encoders for an A/D converter, comprises:

means for generating a thermometric code of plural bits having a level determined by a level of an analog signal to be converted to a digital signals;

first to Nth encoders for encoding the thermometric code to provide the digital signal, each of the first to Nth encoders being supplied with a corresponding group of bits obtained by dividing the plural bits of the thermometric code by N, where N is an integer equal to or more than 2; and means for selecting one of the first to Nth encoders in accordance with a high or low level state(s) of a bit(s) at an (N−1)-dividing position(s) in division of the plural bits of the thermometric code by N, the one of the first to Nth encoders providing the digital signal converted from the analog signal.

According to the invention, since a logic signal-synthesizing circuit after dividing data lines is no longer necessary, a high speed operation with lower power consumption can be realized.

Further, according to the invention, since encoders are generally operated exclusively or independently from the other circuits, by supplying parts of a thermometric code as control signals output from comparators at a previous stage to divided encoders, the encoding bit lines are not precharged unnecessarily and the power consumption can be reduced.

Still further, according to the invention, since the thermometric code is directly provided as control signals for divided encoders, an encoder-dividing control circuit can be simplified.

The divided encoders and data line-dividing circuit are provided, so that it is not necessary to provide a complicated timing design, which has been required for the conventional high-speed A/D converter, and it is possible to apply a static type logic circuit to a low-speed A/D converter device. Namely, the freedom of circuit design can be improved.

BRIEF DESCRIPTION OF THE DRAWING

The invention will be explained in more detail in conjunction with appended drawings, wherein.

DESCRIPTION OF THE PREFERRED EMBODIMENTS

Figure 1:
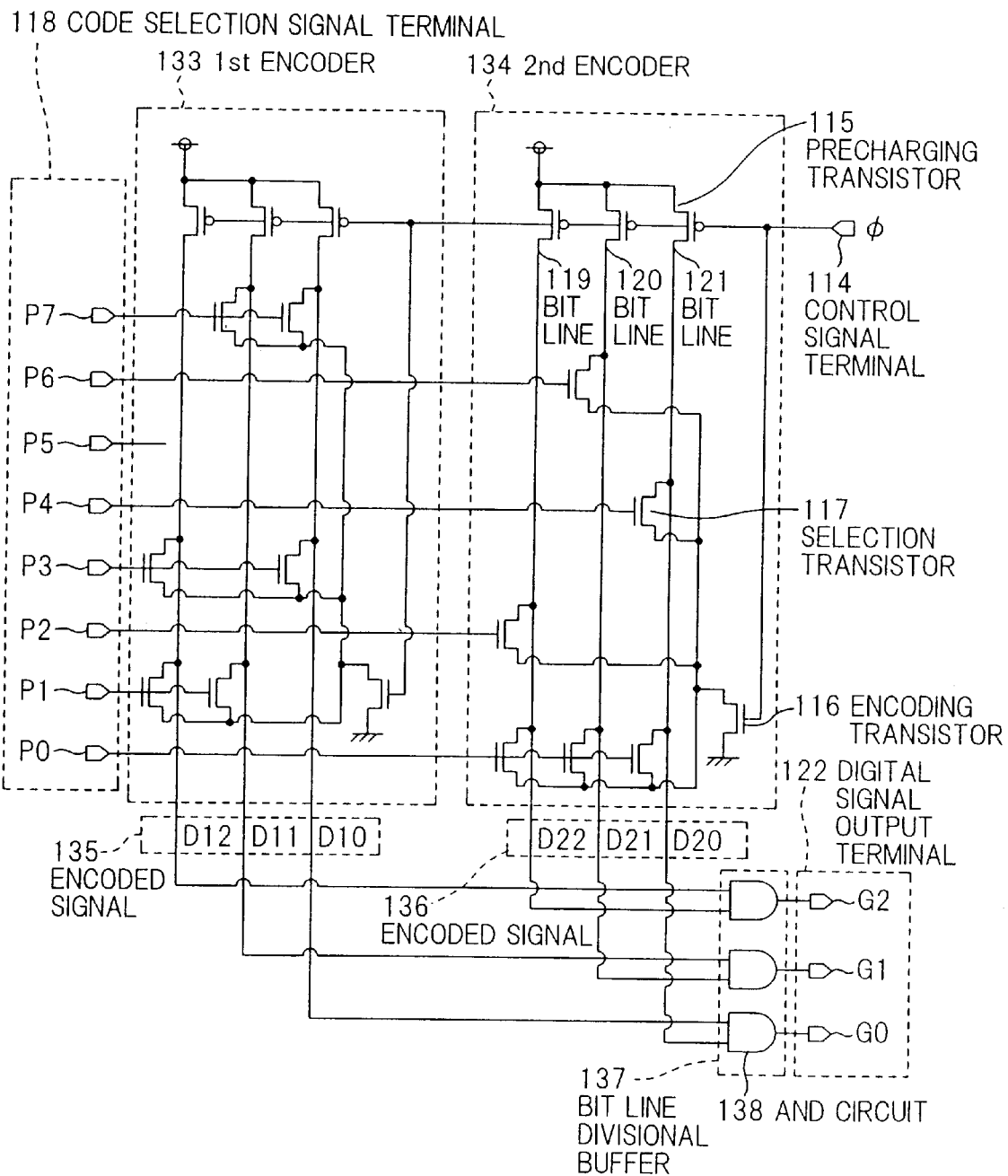
FIG. 1 is a circuitry diagram showing a conventional bit line division encoding circuit.
Figure 2:
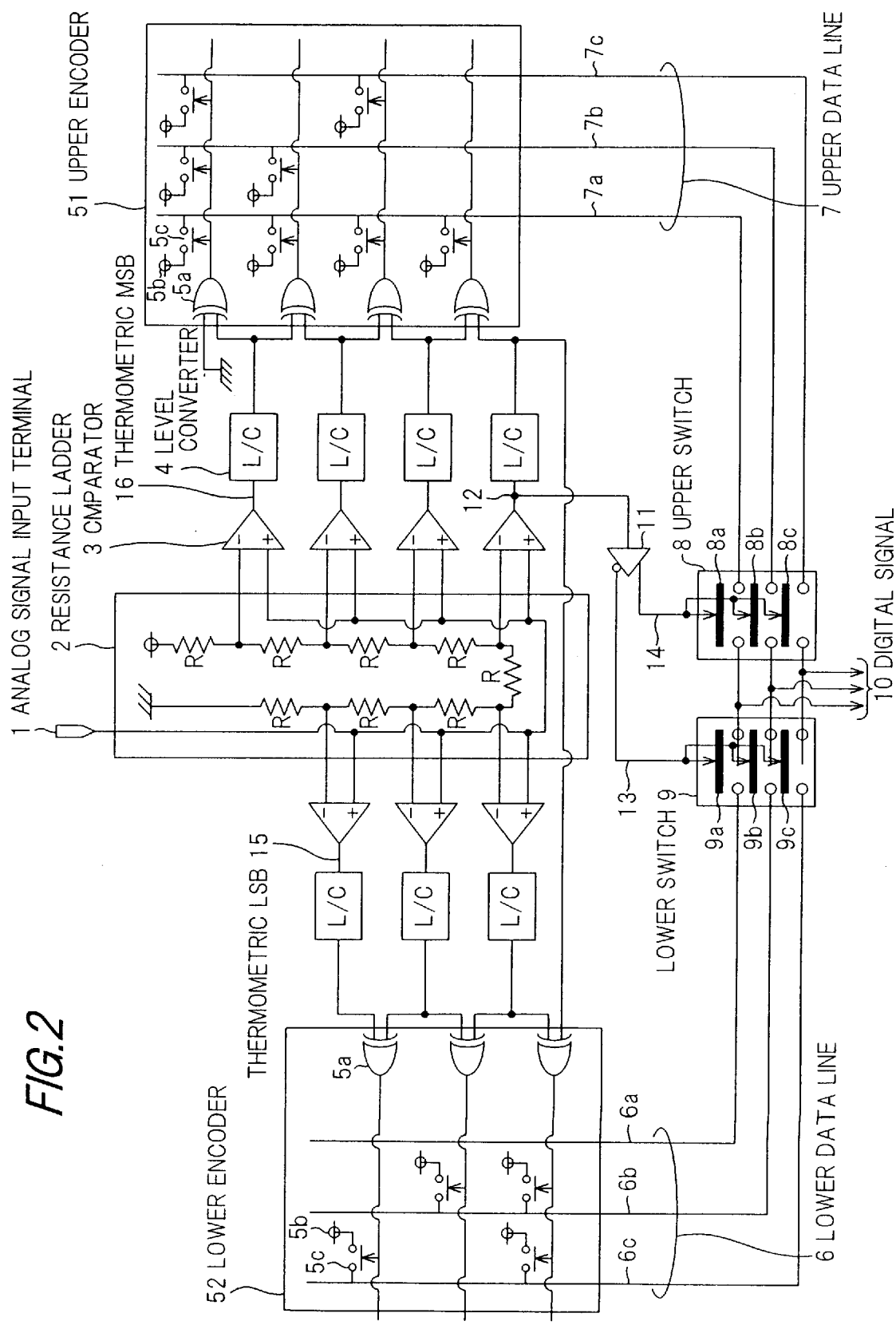
FIG. 2 is a circuitry diagram showing a circuit for selecting one of divided encoders for an A/D converter in a first preferred embodiment according to the invention.

FIG. 2 shows a circuit for selecting one of divided encoders for an A/D converter in a first preferred embodiment according to the invention.

In FIG. 2, an analog signal is input to an analog signal input terminal 1 of a resistance ladder 2. Each of taps (resistance nodal points) of the resistance ladder 2 is connected to each of (−) input terminals of comparators 3, on the other hand, the analog signal is input to (+) input terminals of the comparators 3, and output terminals of the comparators 3 are connected to level converters (L/C) 4.

Output terminals of the level converters 4 are connected to an upper encoder 51 and a lower encoder 52, which are provided for realizing a desired encoding operation, and the upper and lower encoders 51 and 52 are connected to upper and lower data lines 6 and 7, respectively. Each of the level converters 4 converts an output level of a corresponding comparator 3 to a level which is appropriate to be processed in the upper and lower encoders 51 and 52.

The upper and lower data lines 6 (6a to 6c) and 7 (7a to 7c) are connected to first terminals of upper and lower switches 8 (8a to 8c) and 9 (9a to 9c), respectively, and a digital signal 10 of three bits is output from nodal points between second terminals of the upper and lower switches 8 and 9.

In general, with considering the encoding precision, the comparators 3, the level converters 4, the upper and lower encoders 51 and 52, and the upper and lower encoder data lines 6 and 7 are provided at an outer periphery of the resistance ladder 2 so as to surround the resistance ladder 2 in the aforementioned order, in the circuit configuration as shown in FIG. 2.

Next, a signal from a bit 12 having a predetermined level (output signal of the mediate comparator 3) of a thermometric code is input to an input terminal of a division control circuit 11, and first and second complementary control signals 13, 14 are output from output terminals of the control division circuit 11. The first complementary control signal 14 is provided for controlling the upper switch 8 and the second complementary control signal 13 is provided for controlling the lower switch 9.

Herein, a thermometric MSB 16 is a most significant bit of the thermometric code and a thermometric LSB 15 is a least significant bit of the thermometric code.

Next, a comparator terminal for the bit 12 outputting a predetermined level of the thermometric code is selected in accordance with the divisional number, as explained below. When an encoder is divided into two, a comparator output terminal is selected having a half value of the thermometric code. When an encoder is divided into three, comparator output terminals are selected having ⅓ and ⅔ values of the thermometric code. In general, an encoder is divided into a divisional number N, comparator output terminals having 1/N, 2/N, . . . (N−1)/N values of the thermometric code are selected for providing the control signals.

In FIG. 2, each of the upper and lower encoders 51 and 52 comprises exclusive OR circuits 5a, power supplies 5b, and switching transistors 5c. The upper and lower encoders 51 and 52 comprise bit lines 7a, 7b and 7c, and 6a, 6b and 6c, and the upper and lower switches 8 and 9 comprise bit line switches 8a, 8b and 8c, and 9a, 9b and 9c, respectively.

In operation, an analog data signal, which is input from the analog signal input terminal 1, is converted into a thermometric code by the resistance ladder 2 and the comparators 3 in accordance with the magnitude of the value thereof.

Next, the thermometric code is converted into a desired binary code by the level converters 4 and the upper and lower encoders 51 and 52.

When the bit signal 12 of the thermometric code is low, the lower encoder 52 connected to the lower data lines 6 is activated, and the upper encoder 51 connected to the upper data lines 7 is non-activated. In the similar manner, when the bit signal 12 of the thermometric code is high, the upper encoder 51 connected to the upper data lines 7 is activated.

Namely, it is possible to judge previously whether the converted binary data is determined by the lower encoder 52 connected to the lower data lines 6 or the upper encoder 51 connected to the upper data lines 7, in accordance with the bit signal 12 having a half value (central value) of the thermometric code, which is expressed as "0" or "1".

This judging function is conducted by the division control circuit 11, the control signals 13 and 14, and the upper and lower switches 8 and 9.

In operation, when a digital signal is determined by the lower data line 6 by the function of the bit signal 12 and the control circuit 11, the control signal 14 is inactive to turn the upper switch 8 to OFF state, on the other hand, the control signal 13 is active to turn the lower switch 9 to ON state. Therefore, before the data of the thermometric code is supplied to the level converters 4 and the upper and lower encoders 51 and 52, a signal-transmitting path is switched such that the lower data line 6 is connected to the digital signal output terminal for outputting the digital signal 10 via the lower switch 9.

In the similar manner, when the digital signal is determined by the upper data line 7, the control signal 13 is switched to inactive state and the lower switch 9 is switched to OFF state, on the other hand, the control signal 14 is switched to active state and the upper switch 8 is switched to ON state. Therefore, before the data of the thermometric code is supplied to the level converter 4 and the upper and lower encoders 51 and 52, a signal-transmitting path is switched such that the upper data line 7 is connected to the digital signal output terminal for outputting the digital signal 10 via the upper switch 8.

Accordingly, by previously separating the unnecessary encoder 51 or 52 before the upper and lower encoders 51 and 52 reverse the upper and lower data lines 7 and 8, load of the data lines is lowered, so that high speed operation with low power consumption can be realized.

Figure 3:
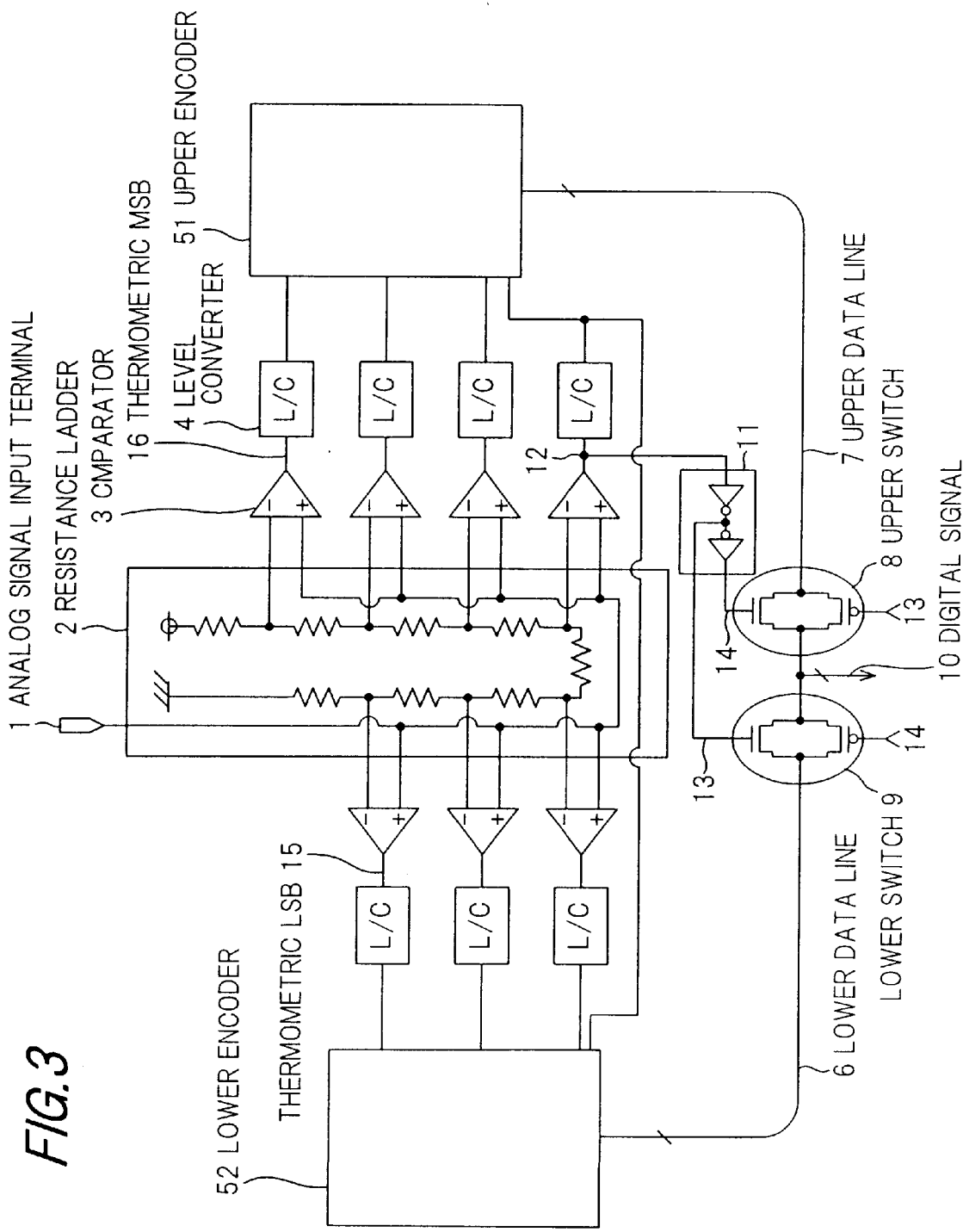
FIG. 3 is a circuitry diagram showing a circuit for selecting one of divided encoders for an A/D converter in a second preferred embodiment according to the invention.

FIG. 3 shows a circuit for selecting one of divided encoders for an A/D converter in a second preferred embodiment according to the invention.

In FIG. 3, the circuit comprises an analog signal input terminal 1, a resistance ladder 2, comparators 3, level converters 4, upper and lower encoders 51 and 52, 3-bit upper and lower data lines 6 and 7, upper and lower switches 8 and 9, which are CMOS transfer gates composed of NMOS and PMOS transistors, and a division control circuit 11. Further, in FIG. 3, 10 denotes a digital signal, 12 denotes a control circuit input signal, and 13 and 14 denote switch control signals.

In operation, when a bit signal 12 output from the mediam comparator 3 is "0", the control signals 13 and 14 output from the division control circuit 11 are switched to H level and L level, respectively, so that the lower switch (transfer gate) 9 is switched to ON state, and a binary code determined by the lower encoder 52 is output via the lower data line 6 as the digital signal 10 from the digital signal output terminal.

In the similar manner, when the bit signal 12 output from the mediam comparator 3 is "1", the upper switch (transfer gate) 8 is switched to ON state, and a binary code determined by the upper encoder 51 is output via the upper data line 7 as the digital signal 10 from the digital signal output terminal.

At this time, the encoder which is unnecessary for determining the digital signal is separated by the upper or lower switch (transfer gate), load of the data line is lowered, so that high speed operation and low power consumption can be realized.

Figure 4:
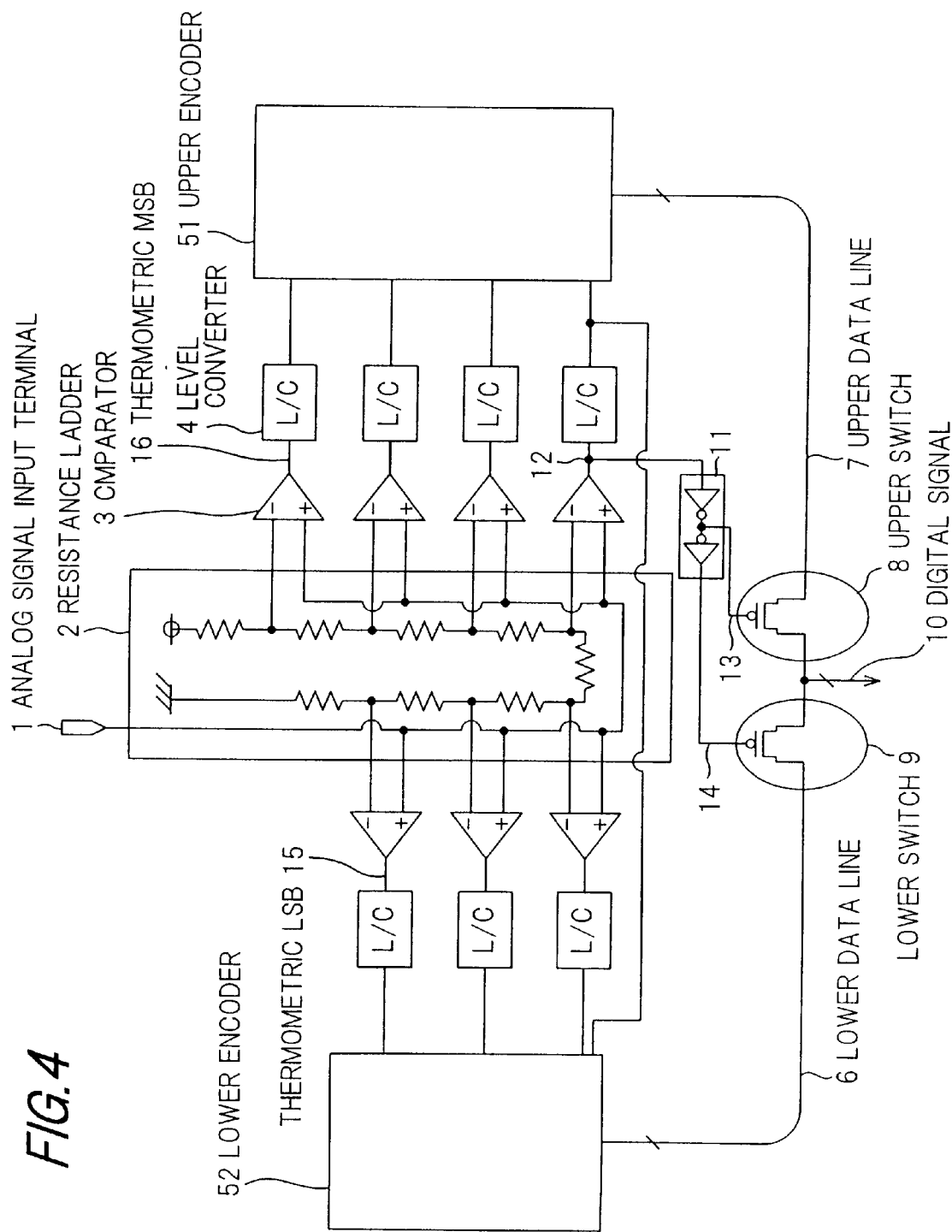
FIG. 4 is a circuitry diagram showing a circuit for selecting one of divided encoders for an A/D converter in a third preferred embodiment according to the invention.

FIG. 4 shows a circuit for selecting one of divided encoders for an A/D converter in a third preferred embodiment according to the invention, in which the upper and lower switches 8 and 9 are composed of PMOS transistor switches.

In FIG. 4, since the upper and lower switches 8 and 9 are composed of only the PMOS transistor switches, load of the division control circuit 11 can be reduced, so that switching operation of the upper and lower switches can be conducted with high speed. Therefore, the high-speed operation of the whole encoding circuit can be realized, and the power consumption can be reduced, since the load of the whole encoding circuit can be reduced.

Figure 5:
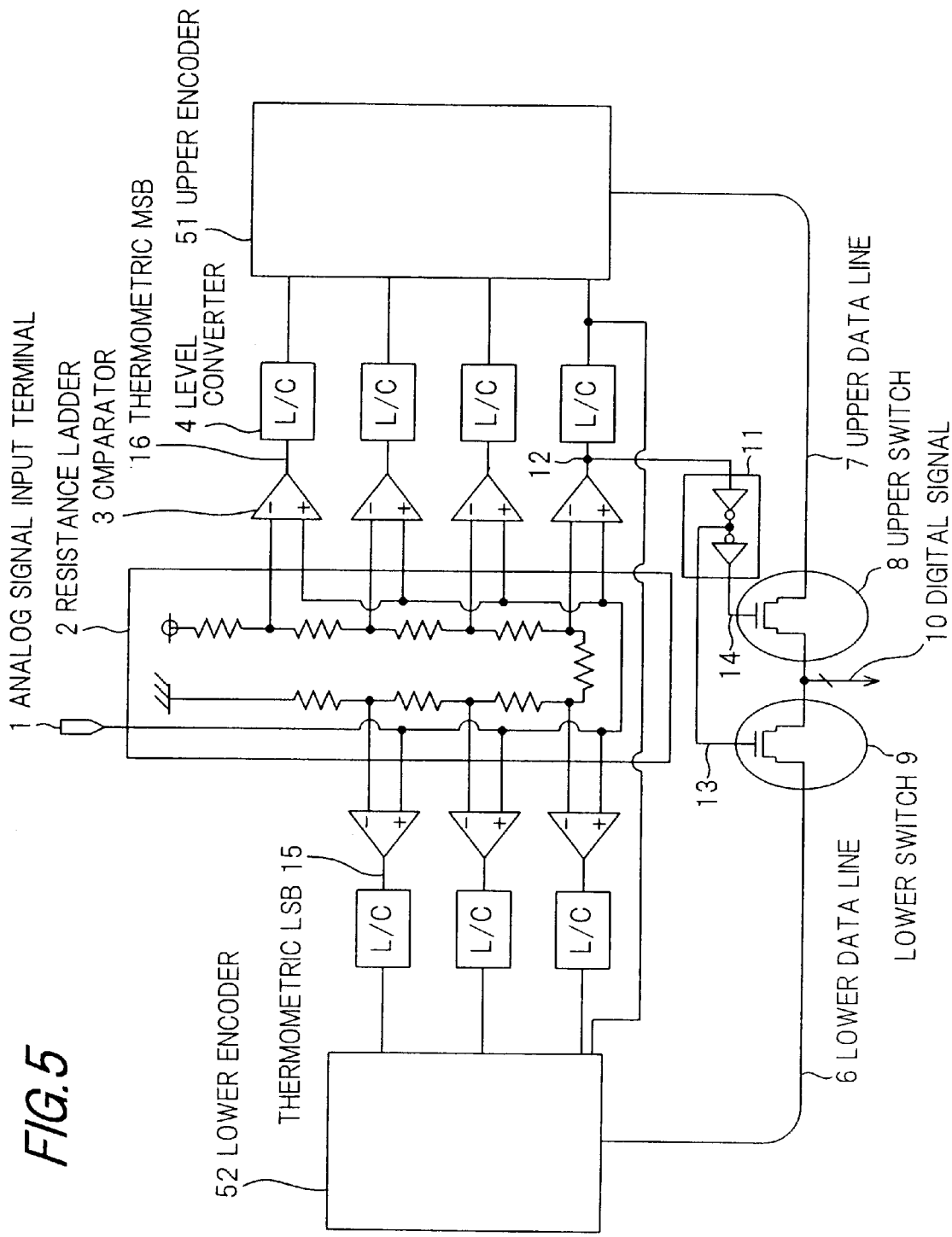
FIG. 5 is a circuitry diagram showing a circuit for selecting one of divided encoders for an A/D converter in a fourth preferred embodiment according to the invention.

FIG. 5 shows a circuit for selecting one of divided encoders for an A/D converter in a fourth preferred embodiment according to the invention, in which the upper and lower switches 8 and 9 are composed of NMOS transistor switches. The same advantages are obtained as in FIG.4.

Figure 6:
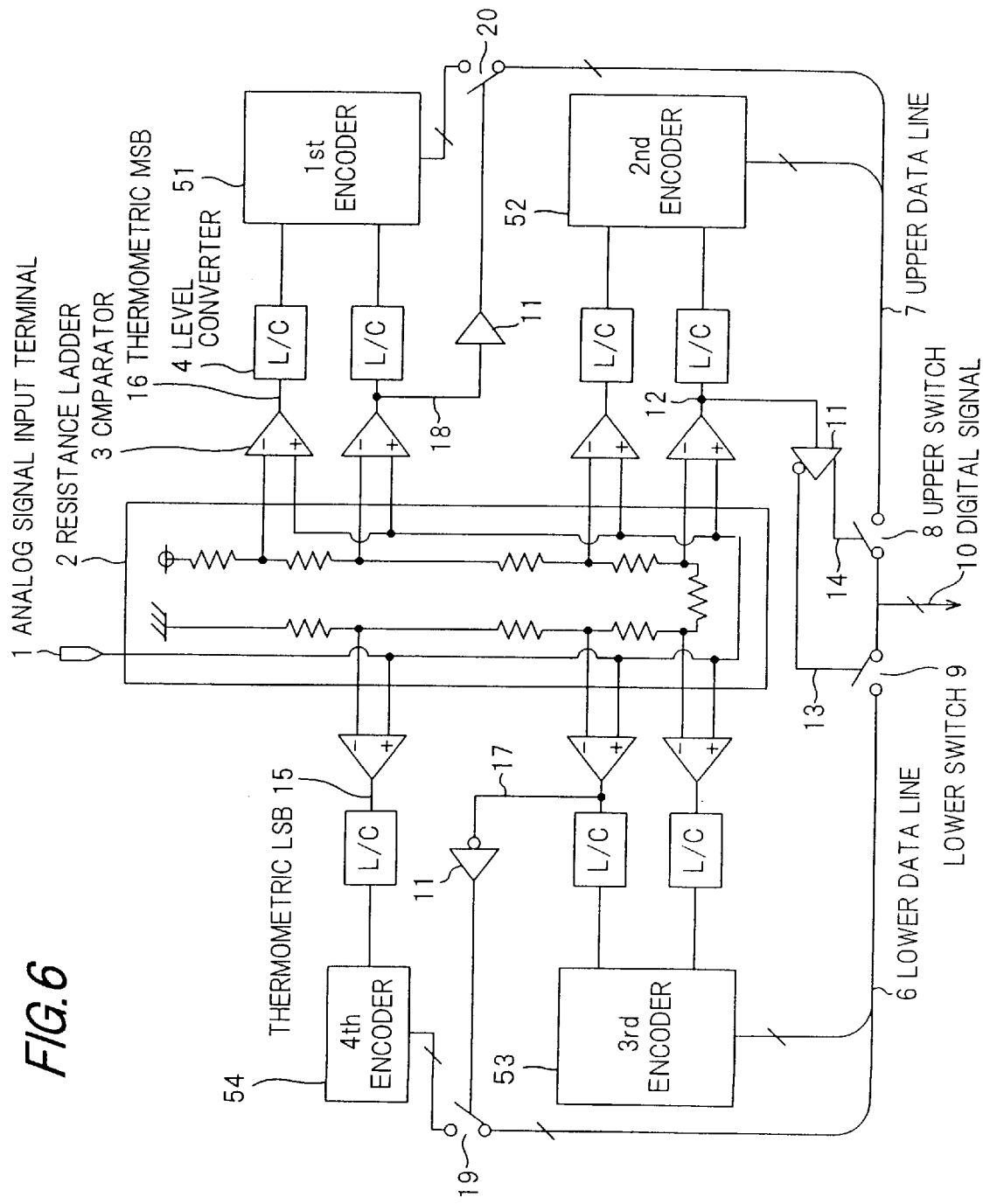
FIG. 6 is a circuitry diagram showing a circuit for selecting one of divided encoders for an A/D converter in a fifth preferred embodiment according to the invention.

FIG. 6 shows a circuit for selecting one of divided encoders for an A/D converter in a fifth preferred embodiment according to the invention, in which data lines for 3-bit encoding circuit are divided into four.

In FIG. 6, bit signals 12, 17 and 18 output from three of the second lowest comparators 3 are input to the division control circuits 11. Herein, 19 and 20 denote encoder charge separating gates.

In operation, when the digital signal 10 is determined by a fourth encoder 54, by the function of the bit signal 17 output from the second lowest comparator 3, the encoder separating gate 19 is switched to ON state and the fourth encoder 54 is connected to the lower data line 6, finally the signal having the value of the fourth encoder 54 is output via the lower switch 9 as a digital signal 10.

Next, when the digital signal 10 is determined by a second encoder 52 or a third encoder 53, the encoder separating gates 19 and 20 are switched to OFF state, so that load of the lower and upper data lines 6 and 7 can be reduced. Therefore, the high speed operation with low power consumption can be realized.

In the similar manner, when the digital signal 10 is determined by a first encoder 51, the encoder separating gate 19 is switched to OFF state, so that the fourth encoder 54 is separated from the lower data line 6, at the same time, the encoder separating gate 20 is switched to ON state, so that the first encoder 51 is connected to the upper data line 7.

Since the data lines are divided into plural, the average conversion speed and the power consumption can be improved.

Figure 7:
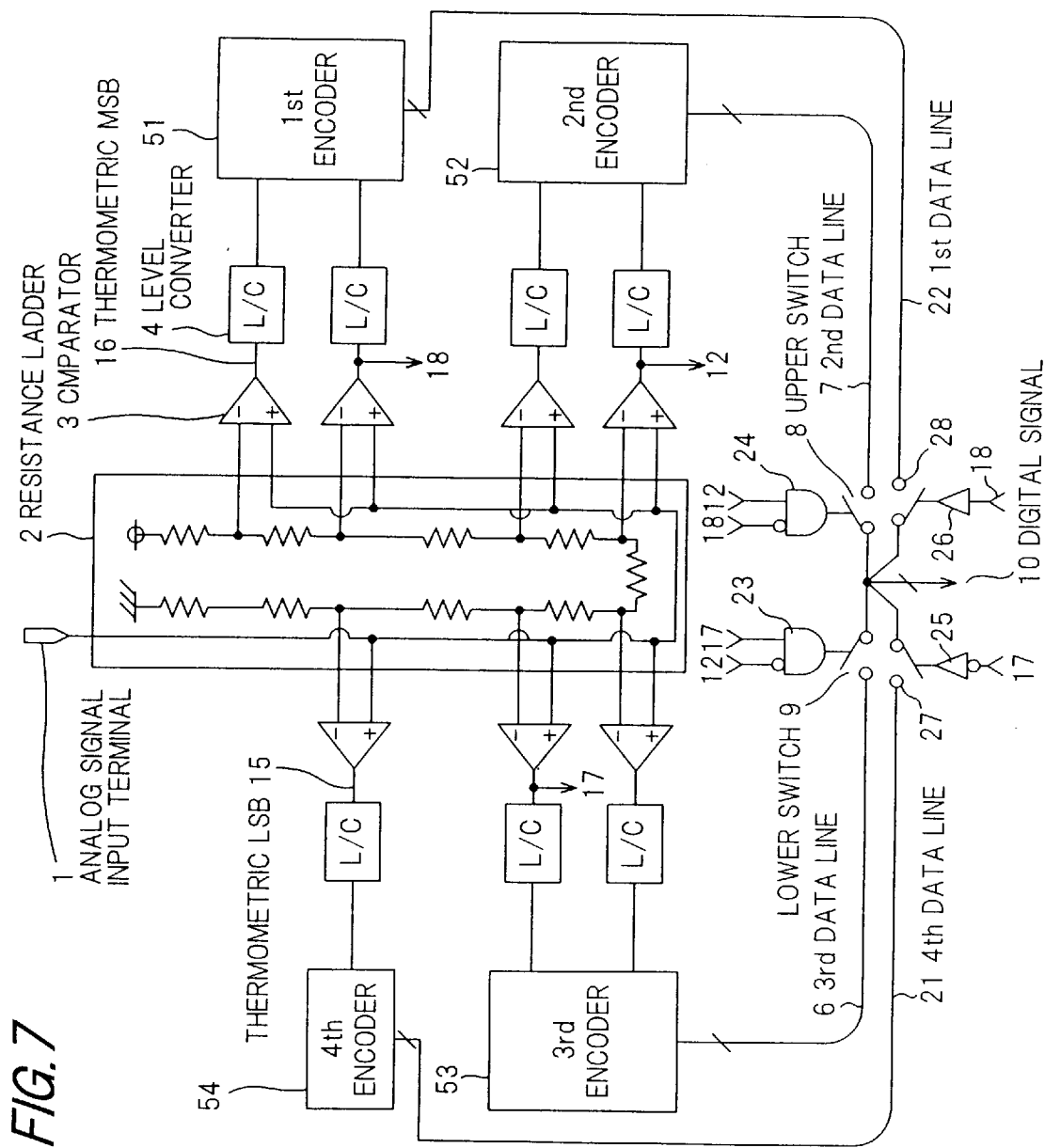
FIG. 7 is a circuitry diagram showing a circuit for selecting one of divided encoders for an A/D converter in a sixth preferred embodiment according to the invention.

FIG. 7 shows a circuit for selecting one of divided encoders for an A/D converter in a sixth preferred embodiment according to the invention.

In FIG. 7, first to fourth data lines 6, 7, 21, and 22 are switched by control circuits 23 to 26 and switches 8, 9, 27, and 28, with using bit signals 12, 17 and 18 output from three of the comparators 3. The reference numerals 12, 17 and 18 of input terminals of the control circuits 23 to 26 mean that the bit signals 12, 17 and 18 are applied thereto.

In accordance with the structure having divided data lines, since the load of the data lines can be reduced, the encoding operation with high speed and low power consumption can be realized.

Figure 8A:
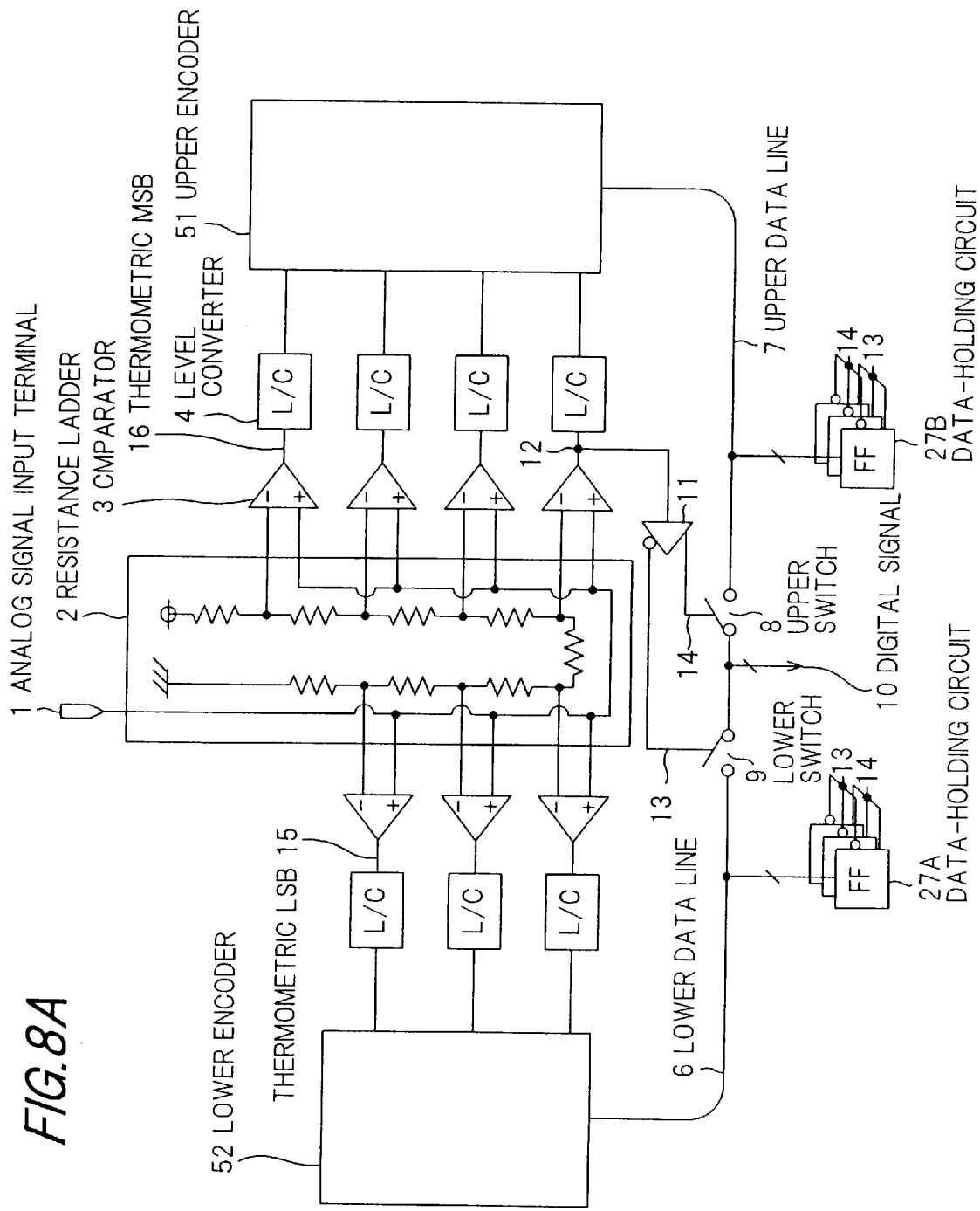
FIGS. 8A and 8B are circuitry diagrams showing a circuit for selecting one of divided encoders for an A/D converter in a seventh preferred embodiment according to the invention.
Figure 8B:
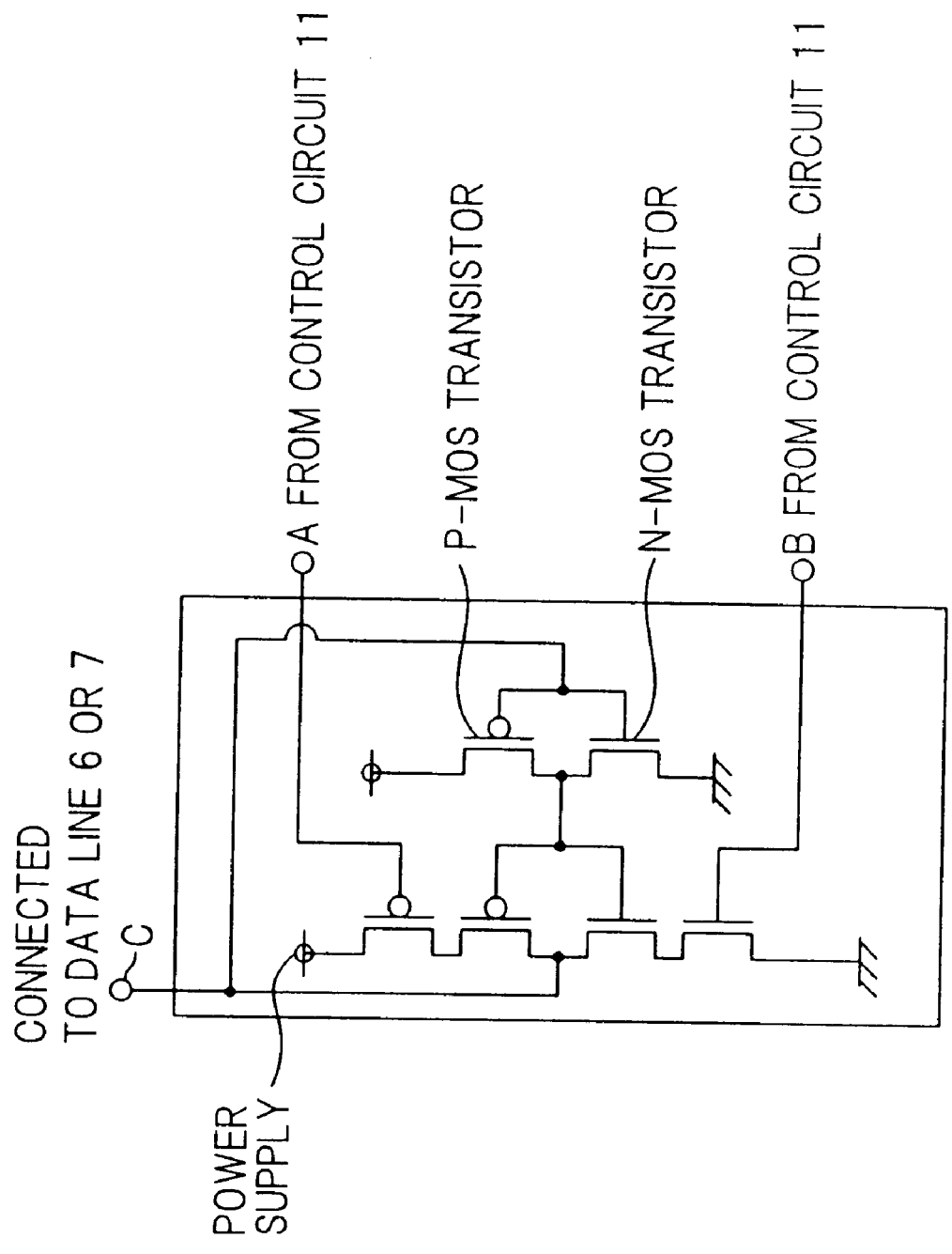

FIG. 8A shows a circuit for selecting one of divided encoders for an A/D converter in a seventh preferred embodiment according to the invention, in which data-holding circuits 27A and 27B are added to the circuit in the second preferred embodiment shown in FIG. 3. The data-holding circuits 27A and 27B connected to three bit lines respectively are provided for preventing the floating of one of the upper and lower data lines 6 and 7, which is separated from the terminal for the digital signal 10. FIG. 8B shows an inner structure of each of the data-holding circuits 27A and 27B, which comprises terminals A and B to which control signals 13 and 14 are input from the control circuit 11, respectively, and a terminal C to which a bit line data corresponding to the data line 6 or 7 are applied, and the bit line data are held in three PMOS transistors and three NMOS transistors, respectively.

Since the data-holding circuit can be applied for the circuit having divided encoders of more than two, a dynamic encoder which has not been appropriately used in low speed operation can be applied to such low sped operation.

The above described divisional method or holding method can be applied to other apparatus independently of the difference of the bit number or the code conversion mode of the output digital code, such as the binary code or the gray code.

As described above, according to the invention, following effects can be obtained.

The first effect of the invention is that, by providing a structure in which the high speed operation given by the division of the data line is maintained and a logic signal-synthesizing circuit is omitted, the high speed encoding operation is achieved and the power consumption can be reduced.

The second effect of the invention is that, since parts of the thermometric code are effectively used as a division control signal, unnecessary charging and discharging of the data lines can be reduced and the power consumption can be reduced.

The third effect of the invention is that, since parts of the thermometric code are directly used as a division control signal, the structure of a control circuit can be simplified.

The fourth effect of the invention is that encoders and data line division circuit can be applied to circuits other than a dynamic type logic circuit, which requires precharging and discharging.

Therefore, it is not necessary to provide a complicated timing design, which has been required for the high-speed conversion device using a dynamic type logic circuit as the encoder, and it is possible to use a static type logic circuit as the encoder, which requires a simple timing design. Namely, the freedom of circuit design can be improved.

Although the invention has been described in detail with particular reference to preferred embodiments, but it will be understood that variations and modifications can be effected within the scope of the invention as set forth in the appended claims.

What is claimed is:

1. A circuit for selecting one of divided encoders for an A/D converter, comprising:

means for generating a thermometric code of plural bits having a level determined by a level of an analog signal to be converted to a digital signals;

first to Nth encoders for encoding said thermometric code to provide said digital signal, each of said first to Nth encoders being supplied with a corresponding group of bits obtained by dividing said plural bits of said thermometric code by N, where N is an integer equal to or more than 2; and means for selecting one of said first to Nth encoders in accordance with a high or low level state(s) of a bit(s) at an (N−1)-dividing position(s) in division of said plural bits of said thermometric code by N, said one of said first to Nth encoders providing said digital signal converted from said analog signal.

2. The circuit as defined in claim 1, wherein:

said selecting means, comprises:
  first to Nth data lines connected to outputs of said first to Nth encoders;
  an output date line for providing said digital signal; and
  switches for connecting one of said first to Nth data lines to said output data line in accordance with said high or low level state(s) of said bit(s) at said (N−1)-dividing position(s).

3. The circuit as defined in claim 1, wherein:

said generating means, comprises:
  a resistance ladder comprising plural resistances connected in series between two reference voltages, each nodal point of said plural resistances providing a reference voltage;
  plural comparators each connected to a corresponding one of nodal points of said plural resistances at a first input thereof and connected to an analog signal input terminal at a second input thereof, said plural comparators generating said thermometric code.

4. The apparatus as defined in claim 2, wherein:

each of said first to Nth data lines comprises a number of bit lines equal to a bit number of said digital signal, each of said bit lines being connected to a data-holding circuit, said data-holding circuit holding data at a corresponding bit line of one of said first to Nth data lines which is not connected to said output data line.

* * * * *